(12) United States Patent
Onitani et al.

(10) Patent No.: US 6,759,740 B2
(45) Date of Patent: Jul. 6, 2004

(54) COMPOSITE CERAMIC BOARD, METHOD OF PRODUCING THE SAME, OPTICAL/ELECTRONIC-MOUNTED CIRCUIT SUBSTRATE USING SAID BOARD, AND MOUNTED BOARD EQUIPPED WITH SAID CIRCUIT SUBSTRATE

(75) Inventors: Masamitsu Onitani, Kokubu (JP); Takeshi Matsui, Kokubu (JP); Shigeki Yamada, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/113,467

(22) Filed: Mar. 29, 2002

(65) Prior Publication Data

US 2003/0034554 A1 Feb. 20, 2003

(30) Foreign Application Priority Data

Mar. 30, 2001 (JP) ........................................ 2001-098718
May 30, 2001 (JP) ........................................ 2001-162936
May 31, 2001 (JP) ........................................ 2001-164637

(51) Int. Cl.$^7$ ............................................. H01L 23/12
(52) U.S. Cl. ........................ 257/705; 257/702; 438/125
(58) Field of Search ................................ 257/705, 703, 257/702, 701, 758; 438/125, 106

(56) References Cited

U.S. PATENT DOCUMENTS 6,306,511 B1 * 10/2001 Nakao et al. ................ 428/426
2002/0061629 A1 * 5/2002 Nishide et al. ............. 438/453

* cited by examiner

Primary Examiner—Roy Potter
(74) Attorney, Agent, or Firm—Hogan & Hartson LLP

(57) ABSTRACT

A composite ceramic board comprising an insulating board of insulating layers of alumina ceramics and dielectric layers of ceramics having a dielectric constant smaller than that of said insulating layers which are fired as a unitary structure, and metallized wirings of a low-resistance conductor such as of Au, Ag, Cu or Pl formed on the surfaces and inside thereof, and a method of producing the same. The composite ceramic board not only has a large strength and a high thermal conductivity but also exhibits excellent high-frequency characteristics and is suited for use as a high-frequency wiring board. The invention further provides an optical/electronic-mounted circuit substrate using the above board, and a mounted board having the circuit substrate of the invention connected to an electronic circuit formed on a mother board.

24 Claims, 5 Drawing Sheets

COMPOSITE CERAMIC BOARD, METHOD OF PRODUCING THE SAME, OPTICAL/ELECTRONIC-MOUNTED CIRCUIT SUBSTRATE USING SAID BOARD, AND MOUNTED BOARD EQUIPPED WITH SAID CIRCUIT SUBSTRATE

BACKGROUND OF THE INVENTION

1. Field of the Invention

The present invention relates to a composite ceramic board which has a plurality of ceramic insulating layers formed as a unitary structure upon firing, features a large strength, a high thermal conductivity, and is particularly suited as a wiring board for high-frequency use, relates to a method of producing the same, to an optical/electronic-mounted circuit substrate using said board, and to a mounted board equipped with said circuit substrate.

2. Description of the Related Art

Accompanying the trend toward highly densely integrating the semiconductor devices and transmitting signals at high frequencies in recent years, it has been urged to mount the semiconductor devices on a wiring board that has further improved thermal properties and electrical properties.

Namely, as the semiconductor devices are highly densely integrated, an increased amount of heat is generated from the semiconductor devices. To prevent the semiconductor devices from malfunctioning, it is necessary to quickly release the heat out of the devices. Therefore, the wiring board mounting the semiconductor devices must have a high thermal conductivity.

Further, transmitting the signals at a high frequency brings about an increase in the speed of the operation, while a delay in the signals hinders the attempt for increasing the speed of operation.

To prevent the delay in the signals, therefore, wiring layers must be formed using a low-resistance conductor having a small conduction loss.

Accompanying the recent widespread use of multi-media, on the other hand, it is becoming necessary to transmit and receive tremendous amounts of image data, and attention has been given to optical communication capable of transmitting and receiving large amounts of data at high speeds.

The optical communication device has a structure in which electronic semiconductor devices and multi-chip modules are connected together through optical waveguides in a complex manner frequently intersecting the waveguides. In order to decrease the size of the device by processing optical signals and electric signals using the same mounted substrate and to cope with the complex optical inter-connection, therefore, there has been frequently employed an optical/electronic-mounted circuit substrate of a structure forming optical waveguides on the ceramic board and mounting optical semiconductor devices and electronic semiconductor devices.

The optical/electronic-mounted circuit substrate, too, uses the above-mentioned wiring board, and must have a high heat-radiating property to cope with an increase in the amount of heat generated as a result of a high degree of integration and high frequencies, and must have a decreased resistance of the conductor to meet the demand for performing the operation at high speeds.

As a wiring board for mounting such semiconductor devices, there has heretofore been much used a ceramic board obtained by depositing conductor layers (wiring layers) of a high-melting point metal such as tungsten or molybdenum on the surfaces or inside of the insulating board made of alumina ceramics from the standpoint of reliability.

However, the above-mentioned conventional ceramic board is not capable of fully meeting the above-mentioned modern thermal requirements or electrical requirements.

For example, the conventional alumina ceramics substrate is satisfactory from the standpoint of thermal properties (thermal conductivity). However, since the wiring layers (conductor layers) have been formed of a high-melting point metal, the resistance can be lowered down to only about 8 m$\Omega$/□ or so. Therefore, signal insertion loss is very large, and favorable high-frequency characteristics are not obtained.

Besides, since the insulating board having a wiring layer serving as a terminal for receiving signals is formed of alumina ceramics having a high dielectric constant, high-frequency signals are reflected to a large degree and transmission characteristics are deteriorated.

In order to improve high-frequency signal transmission characteristics by suppressing the reflection of signals, there has been proposed a wiring board obtained by using glass ceramics having a low dielectric constant as an insulating layer of the signal input portions, which is formed integrally with a reinforced glass (Japanese Unexamined Patent Publication (Kokai) No. 239394/1991).

This wiring substrate is satisfactory from the standpoint or high-frequency characteristics (electric characteristics) since the insulating layer mode of glass ceramic has a low dielectric constant and a conductor layer is formed by co-firing a low-resistance conductor such as of copper.

However, the thermal conductivity of the glass ceramics is several watts/m•K at the greatest. Therefore, though high-frequency characteristics can be accomplished, heat is not smoothly radiated from the semiconductor device, and thermal properties (thermal conductivity) are not satisfactory causing the device itself to malfunction.

Besides, the insulating board has a small resistance and is cracked at the time of mounting various devices.

A variety of proposals have heretofore been made to improve problems related to the above-mentioned thermal properties and electric properties (high-frequency characteristics) of the conventional substrate.

For example, Japanese Unexamined Patent Publications (Kokai) Nos. 15101/1995 and 151045/2000 disclose wiring boards formed by co-firing an insulating board made of aluminum oxide and a conductor layer of copper or of a combination of copper and tungsten or molybdenum.

Further, Japanese Unexamined Patent Publications (Kokai) Nos. 106880/1998, 214745/1998 and Japanese Patent No. 3061282 disclose wiring boards equipped with an insulating board having a plurality of insulating layers of dissimilar dielectric constants that are formed integrally together.

According to Japanese Unexamined Patent Publication (Kokai) No. 15101/1995, however, all of the wiring layers (conductor layers) are arranged in the insulating board and are co-fired simultaneously, the insulating layer on the surface of the insulating board is removed by polishing so that the inner wiring layer is exposed on the surface of the insulating board, or a thick-film method or a thin-film method is applied onto the surface of the wiring board after firing thereby to form a surface wiring layer (surface conductor layer).

Therefore, a polishing step, a thick film-forming step and a thin film-forming step are indispensable for forming the surface wiring layer accompanied by such problems as an increased number of the production steps, a decreased yield and an increased cost.

According to Japanese Unexamined Patent Publication (Kokai) No. 151045/2000, the firing is conducted at a temperature of not higher than 1500° C. and, hence, low-melting point metals such as copper and the like are separated little, and a conductor layer having a small resistance is formed.

Besides, the surface wiring layer (conductor layer) of the insulating board, too, is formed by co-firing making it possible to avoid an increase in the cost of production.

However, the insulating layer which is formed of alumina has a dielectric constant of as high as about 9.

In this case, the loss due to the reflection of input signals increases in a region where the signals have a frequency of about 40 GHz, resulting in a decrease in the characteristics.

This holds true for the above-mentioned Japanese Unexamined Patent Publication (Kokai) No. 15101/1995.

According to Japanese Unexamined Patent Publications (Kokai) Nos. 106880/1998, 214745/1998 and Japanese Patent No. 3061282, further, the layers of low dielectric constant are formed as a unitary structure and the insulating board is formed of glass ceramics of a composition that can be fired at a low temperature. Therefore, signals of high frequencies can be processed by using a wiring layer (conductor layer) formed of Cu, Au, Ag or Pt having a low resistance as a chief component.

The boards, however, are not satisfactory in regard to the strength since the insulating board is made of glass ceramics.

Even when, for example, a reinforced glass is used, the bending strength is about 200 MPa at the greatest.

Problem further arouses concerning the heat-radiating property (thermal conductivity).

SUMMARY OF THE INVENTION

It is therefore a first object of the present invention to provide a composite ceramic board which has a large strength, a high thermal conductivity, exhibits excellent high-frequency characteristics, and is particularly useful as a wiring board for high-frequency use.

A second object of the present invention is to provide a method of producing the above composite ceramic board.

A third object of the present invention is to provide an optical/electronic-mounted circuit substrate equipped with the above composite ceramic board.

A fourth object of the present invention is to provide a mounted board mounting the above-mentioned optical/electronic-mounted circuit substrate on an electronic circuit formed on the surface of the mother board through external connection terminals.

According to the present invention, there is provided a composite ceramic board wherein insulating layers of alumina ceramics and dielectric layers of ceramics having a dielectric constant smaller than that of said insulating layers, are laminated as a unitary structure, and conductor layers containing at least one kind of low-resistance conductor selected from the group consisting of Au, Ag, Cu and Pt are formed on the surfaces and/or in the inside.

In the composite ceramic board of the present invention, an insulating board is formed by the insulating layers of alumina ceramics having a high dielectric constant and insulating layers of ceramics having a low dielectric constant which are integrally formed together by firing, to exhibit excellent properties inherent in these insulating layers.

That is, the composite ceramic board includes layers of alumina ceramics that exhibit a high thermal conductivity and large strength and further includes ceramic layers having a low dielectric constant. Upon providing the low-dielectric ceramic layers with an electrode for receiving external signals, therefore, the loss due to the reflection of input signals is effectively decreased and good high-frequency signal transmission characteristics are accomplished.

Further, the above insulating board is formed as a unitary structure by firing at 1200 to 1500° C. Therefore, the conducting layer of a low-resistance conductor such as of copper is formed by co-firing offering a great advantage from the standpoint of production steps.

Moreover, since the conductor layer is formed of a low-resistance conductor such as of copper, the resistance can be decreased and conduction loss can be decreased offering a great advantage in transmitting the high-frequency signals.

In the composite ceramic board of the present invention, when the insulating layers and/or the dielectric layers comprise laminates, wiring can be arranged inside the laminates, and a plurality of devices such as semiconductors can be mounted being highly densely integrated.

Further, the dielectric layer is formed at a position to be exposed on the surface of the board, and a conductor layer that serves as an electrode for receiving external signals is formed on the exposed portion. Namely, the conductor layer that serves as a terminal for receiving signals is formed on the low-dielectric insulating layer to lower the reflection of high-frequency signals input from the wiring layer thereby to avoid a decrease in the transmission characteristics.

In order to effectively conduct the co-firing with the conductor layer containing a low-resistance conductor such as of copper in the present invention, furthermore, it is desired that the alumina ceramic insulating layer contains silica ($SiO_2$) and $Mn_2O_3$ in addition to alumina ($Al_2O_3$) which is a chief component and, particularly, contains from 2 to 15% by weight of manganese oxide and from 2 to 15% by weight of silicon oxide.

It is further desired that the low-dielectric ceramic layer contains, as a chief component, at least one of those selected from the group consisting of mullite, forsterite, enstatite, silica and cordierite for it makes easy to cope with higher frequencies.

It is desired that the conductor layer has a sheet resistance of not larger than 8 mΩ/□ calculated as having a thickness of 15 μm and, further, contains at least one kind of a high-melting point metal selected from W and Mo in addition to a low-resistance conductor and, particularly, contains the low-resistance conductor in an amount of from 10 to 70% by volume and contains the high-melting point metal in an amount of from 30 to 90% by volume.

This makes it easy to decrease the resistance of the conductor layer formed on the surface or in the via-holes of the alumina insulating layer.

As a particularly preferred embodiment of the invention, further, there is provided a composite ceramic board wherein the dielectric layer contains forsterite and cordierite an chief crystal phases and, further, contains, as sub-components, at least one of $SiO_2$, Zn, Mn and alkaline earth metals and/or non-load•non-alkaline borosilicate glass in an amount of from 0.1 to 20% by weight per the whole amount.

the composite ceramic substrate of the above embodiment features a particularly highly intimate adhesion between the alumina insulating layer and the dielectric layer, without warping or cracks of the board, and exhibits very large strength and thermal conductivity as compared to those of the glass ceramics.

In particular, upon containing $SiO_2$ as a subcomponent, the firing can be conducted at a lower temperature, which is desirable.

Upon setting the composition of the dielectric layer having a low dielectric constant to be as described above, it is allowed to decrease the loss due to the reflection of input signals in a high-frequency region and, particularly, to decrease the loss in a region of about 60 GHs.

It is particularly desired that the dielectric layer contains cordierite in an amount of from 20 to 40% by weight per the whole amount.

This decreases the difference in the coefficient of thermal expansion from the alumina insulating layer, effectively suppresses the occurrence of pealing from the alumina insulating layer and of cracks, suppresses the dielectric constant of the low-dielectric ceramic insulating layer to be not larger than 6 to thereby effectively decrease the signal loss.

It is further desired that the alumina insulating layer has a bending strength of not smaller than 350 MPa.

This prevents the board from being cracked when the devices are being automatically mounted and prevents a drop in the yield.

It is further desired that the alumina insulating layer contains Mn in an amount of from 2 to 15% by weight calculated as an oxide thereof, contains Si in an amount of from 2 to 15% by weight calculated as an oxide thereof, contains at least one of Mg, Ca, D, Nb, Cr and Co in an amount of from 0.1 to 4% by weight calculated as an oxide thereof, and has a relative density of not smaller than 95%.

This makes it easy to maintain the strength and the thermal conductivity of the alumina insulating layer.

According to the present invention, further, there is provided a method of producing a composite ceramic board of the above-mentioned preferred embodiment by applying an electrically conducting paste onto low-dielectric green sheets and onto alumina green sheets containing an oxide powder that contains at least one of Sn, Mn, and alkaline earth metals and/or non-lead•non-alkali borosilicate glass powder for the forsterite powder and the cordierite powder in an amount of 0.1 to 10% by weight per the whole amount, laminating the low-dielectric green sheets and the alumina green sheets, and firing the obtained laminate at 1200 to 1500° C.

According to this method, the alumina ceramics having excellent strength and thermal conductivity and the dielectric layer having a low dielectric constant are fired simultaneously, and conductor layers are easily formed inside the substrate and on the surfaces of the substrate.

Further, prior to laminating the low-dielectric green sheets and the alumina green sheets, via-holes are formed in the low-dielectric green sheets and/or in the alumina green sheets, and the via-holes are filled with an electrically conducting paste.

Thus, a three-dimensional wiring is formed in the ceramics, the multi-layer ceramic substrate is easily realized in a small size incorporating such functions as capacitors and inductors.

It is further desired to prepare the low-dielectric green sheets by adding the cordierite powder in an amount of from 20 to 40% by weight per the whole amount.

This makes it possible to match the coefficient of thermal expansion with that of the alumina green sheets, and to reduce the warping and cracks during the firing.

It is further desired that 2 to 15% by weight of $Mn_2O_3$, Z to 15% by weight of $SiO_2$, 0.1 to 4% by weight of at least one of MgO, CaO, $B_2O_5$, $Nb_2O_5$, $Cr_2O_3$ and $CoO_3$ and the remainder of alumina power are mixed together, and are molded to prepare an alumina green sheet.

This makes it easy to lower the firing temperature while nearly maintaining the strength and thermal conductivity of the alumina insulating layer, and to improve the yield of products.

It is further desired to prepare the electrically conducting paste by mixing a copper powder in an amount of from 10 to 70% by volume, and a tungsten powder and/or a molybdenum powder in an amount of from 30 to 90% by volume. This makes it easy to form a conductor layer of a low resistance even at a firing temperature of from 1200 to 1500° C., which is higher than the melting point point of copper.

According to the present invention, further, there is provided an optical/electronic-mounted circuit substrate comprising a composite ceramic board of the invention, an optical waveguide and an optical semiconductor device mounted on one surface side of the composite ceramic board, an electronic semiconductor device mounted on one surface or on the other surface of the composite ceramic board, and an external connection terminal provided on the dielectric layer of the composite ceramic board.

The optical/electronic-mounted circuit substrate of the invention realizes the optical/electronic-mounted circuit substrate of a small loss in a portion of receiving high-frequency signals.

It is particularly desired that the insulating layers and/or the dielectric layers of the composite ceramic board of the invention used in the above-mentioned optical/electronic-mounted circuit substrate, comprise laminates.

Therefore, even when a plurality of semiconductors are mounted, the wirings can be arranged even inside the laminate making it easy to accomplish a highly dense mounting.

It is further desired that the electronic semiconductor device and the optical semiconductor device are mounted on the opposing surfaces of the insulating board.

This makes is possible to decrease the size and to improve the reliability.

It is further desired that the electronic semiconductor device is contained in a cavity formed in the surface of the insulating substrate, and the cavity is air-tightly sealed with a cap.

This stabilizes the characteristics of the electronic semiconductor device and improves the reliability thereof.

It is further desired that the electric layer of the insulating board is formed on a portion of the surface of the insulating layer.

This enables a part generating large amounts of heat, such as an electronic semiconductor device to be mounted on an insulating layer having a high thermal conductivity provided with the dielectric layer.

It is further desired that the optical semiconductor device is provided inside the optical waveguide.

This stabilizes the characteristics of the optical semiconductor device and improves the reliability thereof.

The invention further provides a mounted board wherein an electronic circuit including capacitors, resistors and wiring conductors is formed on the surface of a mother board, an optical/electronic-mounted circuit substrate of the invention is mounted on the electronic circuit via external connection terminals, and a reflection loss of when high-frequency signals of 40 GHz are input to the optical/electronic-mounted circuit substrate is not larger than −10.0 dB.

This mounted board makes it possible to realize an optical communication which is capable of transmitting and receiving large amounts of data at high speeds.

DETAILED DESCRIPTION OF THE PREFERRED EMBODIMENTS

The present invention will now be described with reference to the drawings.

Figure 1:
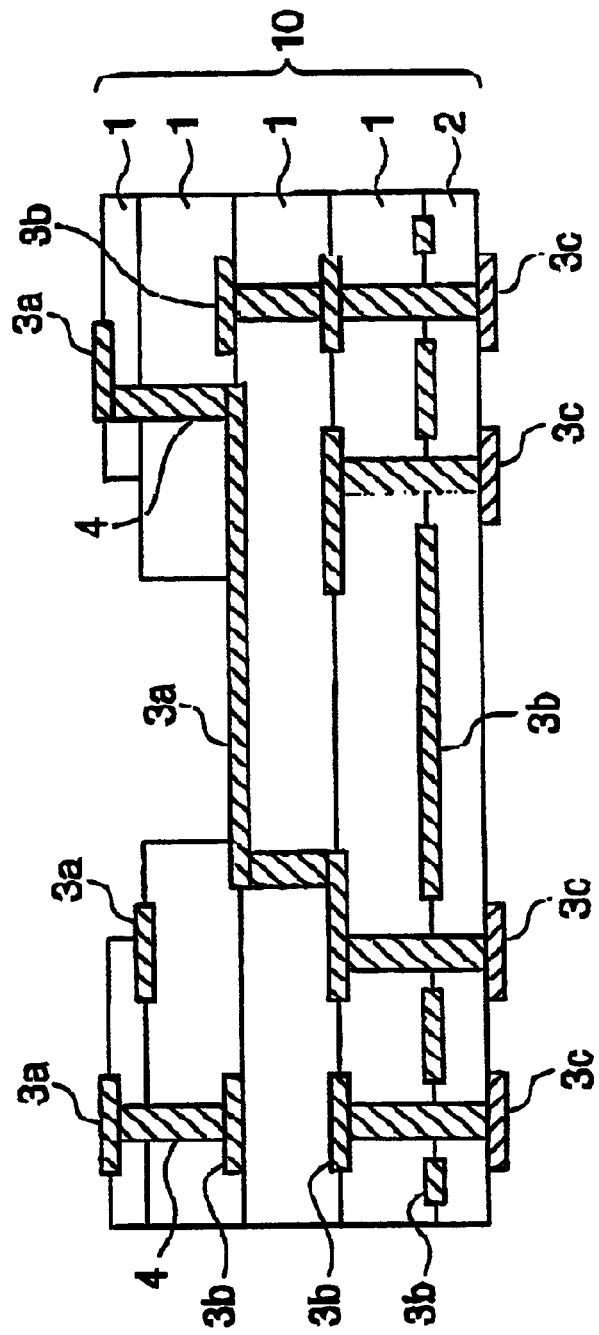
FIG. 1 is a sectional view schematically illustrating a composite ceramic board according to an embodiment of the present invention.

FIG. 1 is a diagram schematically illustrating in cross section the structure of a composite ceramic board of the present invention.

In FIG. 1, the composite ceramic board has an insulating board generally designated at 10. The insulating board 10 comprises alumina ceramic insulating layers (hereinafter simply referred to as alumina layers) 1 which are thin layers of a sintered body formed chiefly of alumina, and a ceramic dielectric layer (hereinafter simply referred to as low-dielectric layer) 2 having a dielectric constant smaller than that of the alumina layers 1, which are laminated as a unitary structure.

Figure 2:
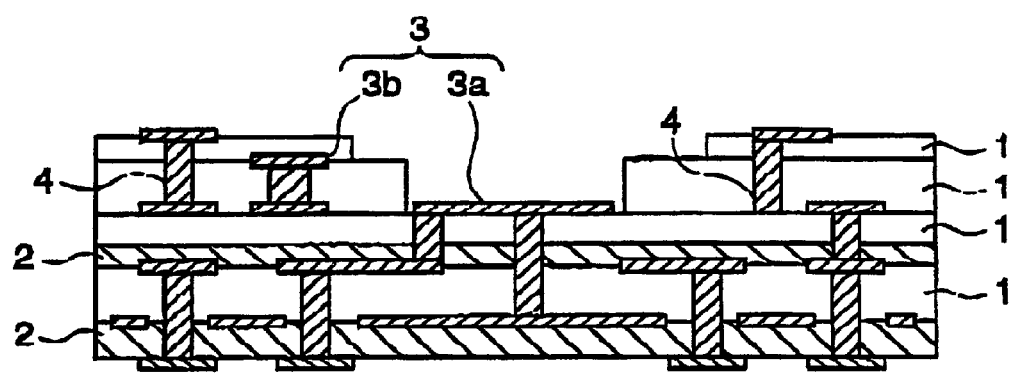
FIG. 2 is a sectional view schematically illustrating a composite ceramic board according to another embodiment of the present invention.

Though the composite ceramic board of FIG. 1 has a laminate structure in which four alumina layers 1 and one low-dielectric layer 2 are laminated as a unitary structure, the present invention is in no way limited to this laminate structure only but may have, as shown in FIG. 2, a structure in which the low-dielectric layers 2 are arranged in a plurality number (two layers in FIG. 2) (this will be described later).

On the surfaces and inside of the insulating board 10, further, there are formed metallized wiring layers (conductor layers) 3a, 3b, 3c and via-hole conductors 4 as shown in FIG. 1.

Among these metallized wiring layers, 3a is a surface wiring layer, 3b is a inner wiring layer, and a metallized wiring layer 3c formed on the surface of the lowermost low-dielectric layer 2 is the one forming an electrode layer for receiving external signals.

The composite ceramic board of this structure is easily obtained by co-firing the alumina layers 1 and the low-dielectric layer 2 constituting the insulating board, metallized wiring layers 3a to 3c, and electrically conducting paste forming the via-hole conductors 4 at a temperature of from 1200 to 1500° C.

(Alumina Layers)

The alumina layers 1 are formed chiefly of aluminum oxide and have a dielectric constant which is not usually smaller than 9.

It is desired that the alumina layers 1 contain not smaller than 84% by weight and, particularly, not smaller than 86% by weight of aluminum oxide from the standpoint of obtaining a large strength and a high thermal conductivity.

That is, when the amount of aluminum oxide is smaller than the above range, the strength and thermal conductivity may decrease.

The aluminum oxide exists as a chief crystal phase of a granular or cylindrical shape. Here, it is desired that the chief crystal phase has an average crystalline particle diameter of from 1.5 to 5.0 μm.

When the average crystalline particle diameter of the main crystal phase is not larger than 1.5 μm, the thermal conductivity may be lost to some extent. When the average particle diameter exceeds 5.0 μm, on the other hand, it becomes difficult to obtain a sufficient degree of strength.

When the main crystal phase comprises cylindrical crystals, the above-mentioned average crystalline particle diameter is based on the short-axis diameter.

The alumina layers 1 are formed by the co-firing with the metallized wiring layers 3a to 3c that contain the low-resistance conductor and, hence, must be fired at a temperature of as low as 1200 to 1500° C. so as to possess a relative density of, for example, not smaller than 95%.

Due to the sintering assistants blended for increasing the density, it is desired that the alumina layers 1 contain manganese and silicon, e.g., contain manganese in an amount of from 2.0 to 15% by weight and, particularly, from 3 to 10% by weight calculated as manganese oxide ($Mn_2O_3$) and contain silicon in an amount of from 2.0 to 15% by weight and, particularly, from 3 to 10% by weight calculated as silicon oxide ($SiO_2$).

That is, when the amount of manganese is smaller than the above-mentioned range, a high density is not accomplished at 1200 to 1500° C. and when the amount of manganese is larger than the above-mentioned range, then, the insulating property may decrease.

When the amount of silicon is smaller than the above-mentioned range, on the other hand, a high density is not accomplished, either, and when the amount of silicon is larger than the above-mentioned range, the thermal conductivity tends to decrease and the dielectric property tends to be deteriorated.

In addition to the above-mentioned components, the alumina layers 1 may further contain an oxide of at least one kind of element selected from Mg, Ca, Sr, B, Nb, Cr and Co, such as an oxide of an alkaline earth element like MgO, CaO or SrO in a total amount of from 0.1 to 15% by weight and, preferably, from 0.1 to 4% by weight.

Namely, use of such compounds as sintering assistants helps further increase the simultaneous sintering with the low-resistance conductor such as of copper contained in the metallized wiring layers.

As a coloring component, further, there may be contained a metal such as tungsten or molybdenum or an oxide thereof in an amount of not larger than 2% by weight calculated as a metal.

The assistants other than aluminum oxide contained in the alumina layers 1 exist as an amorphous phase or as a crystal phase in the grain boundaries of the chief crystal phase of aluminum oxide. From the standpoint of increasing the thermal conductivity, however, it is desired that there has been formed a crystal phase containing assistants.

From the standpoint of obtaining a high thermal conductivity and a large strength, it is desired that the alumina layers 1 comprising the aluminum oxide and other components have a relative density of not smaller than 95%, particularly, not smaller than 97% and, more particularly, not smaller than 98%, and have a thermal conductivity of not smaller than 10 W/m•K, particularly, not smaller than 15 W/m•K and, more particularly, not smaller than 17 W/m•K.

(Low-dielectric Layer)

The low-dielectric layer 2 has a dielectric constant lower than that of the alumina layers 1 and is usually not larger than 8.

From the standpoint of co-firing with alumina, it is desired that the low-dielectric layer 2 contains, as a chief crystal phase, at least one kind of a low-dielectric oxide selected from mullite, forsterite, enstatite, silica and cordierite in an amount of, for example, not smaller than 50% by weight and, particularly, not smaller than 70% by weight.

It is desired that the main crystal phase thereof has an average particle diameter which is not larger than 5 $\mu$m.

When the average particle diameter is not smaller than 5 $\mu$m, cracks occur in the layer due to sintering and the strength of the board may decrease.

The sintering assistants, coloring components or glass components may be contained in the grain boundaries of the main crystal phase in order to increase the density under the co-firing conditions.

In this case, it is desired that the content of the glass components is not larger than 30% by weight, preferably, not larger than 25% by weight, more preferably, not larger than 10% by weight and, particularly preferably, not larger than 5% by weight from the standpoint of maintaining the strength of the board.

When the amount of the glass components is too great, the low-dielectric layer 2 that is formed is deformed during the co-firing at the above-mentioned temperature of 1200 to 1500° C. causing the strength of the board to decrease and causing the glass components to diffuse into the alumina layers 1. As a result, the thermal conductivity decreases.

As the sintering assistants and colouring components, there can be exemplified $Mn_2O_2$, $SiO_2$, $ZnO$, $CaO$, $Nb_2O_5$, $MoO_3$ and $WO_3$, which may be contained in a total amount of from 0.1 to 2% by weight.

That is, use of these components in combination helps further improve the co-firing with the low-resistance conductor such as of copper contained in the metallized wiring layer.

(Metallized Layers (Conductor Layers))

In the present invention, the metallized wiring layers 3a to 3c and the via-hole conductors 4 contain at least one kind of a low-resistance conductor selected from the group consisting of Au, Ag, Cu and Pt, and, particularly preferably, contains Cu.

These low-resistance conductors exist as a continuous phase (matrix) to decrease the conductor loss in the metallized wiring layers 3a to 3c and in the via-hole conductors 4.

It is further desired that these metallized wiring layers contain a high-melting point conductor, such as at least one kind of tungsten (W) or molybdenum (Mo) in order to improve the co-firing property with the above-mentioned alumina layers and the low-dielectric layer 2 and to enhance the shape-retaining property after the co-firing.

Concretely speaking, it is desired that the low-resistance conductor is contained in an amount of from 10 to 70% by volume and, particularly, from 30 to 60% by volume and that the high-melting point conductor is contained in an amount of from 30 to 90% by volume and, particularly, from 40 to 70% by volume.

That is, when the amount of the low-resistance conductor such as Cu is smaller than the above-mentioned range or when the amount of the high-melting point metal is larger than the above-mentioned range, the metallized wiring layers exhibit an increased resistance causing the conductor loss to increase.

Further, when the amount of the low-resistance conductor is larger than the above-mentioned range or when the amount of the high-melting point metal is smaller than the above-mentioned range, the shape-retaining property after the co-firing decreases, and the wiring layers 3a to 3c develop oozing, or the wiring layers are aggregated and broken due to the melting point of the low-resistance conductor such as of Cu and, besides, the wiring layers may peel off due to a difference in the coefficient of thermal expansion between the insulating boards 1 and the wiring layers 3a to 3c.

Further, the via-hole conductors 4 become rugged to a large extent and may escape during the firing.

It is desired that the above-mentioned high-melting point conductor such as W or Mo exists in a spherical crystalline state having an average particle diameter of 1 to 10 $\mu$m or in a state in which several particles are bonded together by firing, being dispersed in the matrix of the low-resistance conductor such as of Cu from the standpoint of maintaining the resistance low and shape-retaining property. From the standpoint of resistance of the conductor layers, preventing the separation and oozing of Cu component, it is particularly desired that the high-melting point conductor has an average particle diameter of from 1.3 to 5 $\mu$m and, most preferably, from 1.5 to 3 $\mu$m.

In the present invention, further, the metallized layers may contain metals such as Ni, Zr, Al, Li, Mg and Zn or oxides thereof, borates thereof, nitrides thereof or carbonates thereof in an amount of from 0.55 to 3.0% by weight calculated as a metal element.

The conductor resistance and the co-firing property are adjusted based upon these metal components.

It is desired that these metal components have an average particle diameter of from 0.6 to 4 $\mu$m and, particularly, from 1.5 to 3.0 $\mu$m.

In the present invention, further, the low-resistance conductor component in the metallized wiring layers 3a to 3c may often diffuse into the alumina layers 1 and into the low-dielectric layer 2 due to the co-firing at a temperature in excess of the melting point point of the low-resistance conductor such as of Cu. Desirably, here, the diffusion distance of the low-resistance conductor component and, particularly, of copper into the layers is not larger than 20 $\mu$m and, particularly, not larger than 10 $\mu$m.

When the diffusion distance increases, the insulating property among the wiring layers decreases and the reliability of the wiring board decreases.

The diffusion distance can be effectively suppressed by conducting the firing in a non-oxidizing atmosphere containing hydrogen and oxygen and having a dew point of not higher than +30° C. and, particularly, from 0 to 25° C.

The metallized wiring layers 3a to 3c and the via-hole conductors 4 having the above-mentioned compositions are so formed as to possess a sheet resistance of not larger than 8 mΩ/□ calculated as having a thickness of 15 $\mu$m.

(Layer Structure)

The composite ceramic board of the present invention is equipped with the insulating board 10 having a layer structure as shown in FIG. 1. Here, however, the layer structure of the insulating board 1 is not limited to the one shown in FIG. 1 but may be modified in a variety of ways.

For example, the insulating board 10 may have a two-layer structure consisting of the alumina layer 1 and the low-dielectric layer 2. Or, as shown in FIG. 2, the insulating board 10 may be of a structure having a plurality of low-dielectric layers 2 (two layers in FIG. 2).

The present invention desirably employs a layer structure in which the low-dielectric layer 2 is located at least one the surface (or on the bottom surface) of the insulating board 10, and the wiring layer 3c that serves as a terminal for receiving signals is formed on the lower-dielectric layer 2.

Namely, upon forming the wiring layer 3c that serves as a terminal for receiving signals on the low-dielectric layer 2, the reflection is decreased at the time when the high-frequency signals are input through the wiring layer 3c to avoid a decrease in the transmission characteristics.

It is particularly desired that the ceramic board used for the optical/electronic-mounted circuit substrate or used for the mounted board mounting the above circuit substrate on a mother board of the present invention that will be described below, employs alumina layers 1 and/or low-dielectric layers 2 which are laminates, the dielectric layers 2 being formed on portions of the surfaces of the alumina layers 1.

Therefore, even when a plurality of semiconductors are mounted, the wirings can be formed even inside the laminates, making it possible to easily accomplish a high density of mounting. It is further allowed to easily mount a part that generates large amounts of heat such as an electronic semiconductor device on the alumina layer 1 having a high thermal conductivity which is provided with the low-dielectric layer 2.

Described below is a preferred embodiment of the composite ceramic board of the present invention that does not permit the board to be warped or cracked at all during the firing, and features a large strength, a high thermal conductivity and excellent high-frequency characteristics owing to its low-resistance conductor wirings.

In the composite ceramic board of this embodiment, the low-dielectric layer 2 contains forsterite and cordierite as chief crystal phases.

Forsterite is necessary for lowering the dielectric constant to be smaller than that of the alumina layers 1, and cordierite works to decrease the difference in the coefficient of thermal expansion from the alumina layers 1, to reduce the residual stress caused by firing, and to suppress the warping and cracking of the board.

The coefficient of thermal expansion of the low-dielectric layer 2 is determined by adjusting the contents of forsterite and cordierite. It is desired that the content of cordierite is from 20 to 40% by weight and, particularly, from 25 to 35% by weight.

It is important that the composite ceramic board of this embodiment contains, as sub-components, at least the of Zn, Mn and alkaline earth metals and/or a non-lead•non-alkaline borosilicate glass.

The sub-components promote the reaction with the alumina green sheet during the firing, enhance the adhering strength to the alumina layers 1, and secures the unitary structure of the alumina layers 1 and the dielectric layers 2.

Besides, $SiO_2$ enables the firing to be conducted at a lower temperature.

In the substrate of this embodiment, in particular, it is desired that the sub-components are contained in an amount of from 0.1 to 20% by weight, particularly, from 1 to 8% by weight and, more particularly, from 3 to 6% by weight per the whole amount of the low-dielectric layers 2.

This is because, when the amount is smaller than 0.1% by weight, the effect of addition is not obtained to a sufficient degree and when the amount exceeds 20% by weight, on the other hand, the liquid phase tends to flow out during the firing.

It is desired that the alumina layers 1 contain at least one kind of Mg, Ca, D, Nb, Cr and Co in an amount of from 0.1 to 4% by weight calculated as an oxide thereof in addition to containing alumina, manganese oxide and silicon oxide.

Use of this composition makes it easy to increase the density even at low temperatures and to maintain a large strength and a high thermal conductivity.

It is desired that the board of this embodiment has a bending strength of not smaller than 350 MPa, particularly, not smaller than 400 MPa and, more particularly, not smaller than 450 MPa.

It is desired that the conductor layers 3 contain Cu in an amount of from 10 to 70% by volume and, particularly, from 30 to 60% by volume, and contain W and/or Mo in an amount of from 30 to 90% by volume and, particularly, from 40 to 70% by volume.

The semiconductor layers 3 having such a composition exhibit a sufficiently low electric resistance, maintain intimate adhesion to the conductor layers 3 and/or to the low-dielectric layers 2, and prevent such inconveniences as peeling of the conductor layers 3, conspicuous ruggedness in the surfaces of the via-hole conductors 4, and missing of via-hole conductors 4 through the firing.

It is further desired that the composition further contains at least one kind of Zr, Al, Li, Mg and Sn in an amount of from 0.05 to 3.0% by weight calculated as a metal element in addition to Cu and W and/or Mo.

Thus, the conductor layers 3 easily acquire a low resistance, and are intimately adhered to the alumina layers 1 and/or to the low-dielectric layers 2.

The composite ceramic board of the present invention constituted as described above exhibits excellently large strength and thermal conductivity, has little reflection loss of high-frequency signals, and can be suitably used for the semiconductor packages, electronic parts-mounted circuit substrates and high-frequency wiring boards.

(Production of Ceramic Board)

A method of producing the composite ceramic board of the present invention will now be described concerning chiefly the method of producing a ceramic board of a preferred embodiment in which the low-dielectric layer 2 contains forsterite and cordierite as chief crystal phases as well as concerning the method of producing ceramic boards of other embodiments.

First, as the starting material powder for producing the alumina layers 1, there is used a mixed powder of an aluminum oxide powder, powders of assistant components such as $Mn_2O_3$, $SiO_2$ and oxides of Mg, Ca, Sr, B, NB, Cr and Co, metal powders of transition metals such as W, Mo and Cr and powders of oxides thereof.

In this case, the assistant components can be used in the form of carbonates, nitrates or acetates capable of forming oxides upon firing.

It is desired that the powder of aluminum oxide has an average particle diameter of from 0.5 to 2.5 $\mu$m and, particularly, from 0.5 to 2.0 $\mu$m, so that the chief crystal phase of aluminum oxide that is formed will assume an average particle diameter that lies within the above-mentioned range.

When use is made of a powder having an excessively large average particle diameter, it becomes difficult to adjust the average particle diameter of the chief crystal phase to lie within the above-mentioned range and, besides, it may become difficult to conduct the firing at a temperature of not higher than 1500° C. as will be described later.

Even when use is made of a powder having a too small average particle diameter, it becomes difficult to adjust the average particle diameter of the chief crystal phase to lie within the above-mentioned range and, besides, it becomes difficult to handle the powder and the cost of the powder becomes high.

The rate of mixing the powder of assistant components is suitably set to as to satisfy the above-mentioned composition of the alumina layers 1.

When, for example, in the case of the board of the above-mentioned preferred embodiment in which the forsterite and cordierite are forming main crystal phases in the low-dielectric layer, the $Mn_2O_3$ powder is added in an amount of from 2 to 15% by weight and, particularly, from 3 to 7% by weight, and the $SiO_2$ powder is added in an amount of from 2 to 15% by weight and, particularly, from 3 to 7% by weight with respect to the aluminum oxide powder.

It is further desired to add a powder of at least one kind of MgO, $Mg(OH)_2$, $MgCO_3$, CaO, $Ca(OH)_2$, $CaCO_3$, $B_2O_5$, $Nb_2O_5$, $Cr_2O_3$ and $CoO_3$ in an amount of from 0.1 to 4% by weight.

Since the firing can now be conducted at a low temperature, there is obtained a highly dense alumina insulating layer, preventing metals from eluting out of the conductor layers 3 and via-hole conductors 4 at the time of firing yet nearly maintaining the strength and the thermal conductivity, and maintaining a high yield of products.

The above powdery composition can be further added with a powder of transition metals such as W, Mo and Cr as well as a powder of oxides as coloring components in an amount of not larger than 2% by weight calculated as a metal.

As the starting material powder for producing the low-dielectric layers 2, there is generally used a mixed powder of a crystalline powder of at least one kind of an oxide having a low dielectric constant selected from mullite, forsterite, enstatite, silica and cordierite, and a powder of assistant components and glass components like those described above.

Like the case of the alumina layers 1, the assistant components can be used in the form of carbonates, nitrates or acetates capable of forming oxides upon firing.

The crystalline powder of the oxide having a low dielectric constant may have an average particle diameter of from 0.5 to 5 $\mu$m and, particularly, from 0.5 to 3 $\mu$m.

When the average particle diameter is not smaller than 5 $\mu$m, the average particle diameter of the chief crystal phase becomes not smaller than 5 $\mu$m, cracks occur in the particles to a conspicuous degree after the firing, and the strength may decrease.

When the average particle diameter is not larger than 0.5 $\mu$m, on the other hand, it may become difficult to handle the powder.

The powder of assistant components is mixed at such a ratio as to satisfy the above-mentioned composition of the low-dielectric layer 2.

In producing the low-dielectric layers 2 in the board of the above-mentioned preferred embodiment, further, it is important to add the forsterite powder, cordierite powder and, as sub-components, an oxide powder and/or a non-lead•non-alkaline borosilicate glass powder containing at least one of Zn, Mn and alkaline earth metals, in an amount of from 0.1 to 10% by weight, particularly, from 1 to 8% by weight and, more particularly, from 3 to 6% by weight per the whole amount.

By adding the sub-components at a ratio of from 0.1 to 10% by weight per the whole amount, the reaction with the alumina green sheet is promoted during the firing, whereby a firm reaction layer is formed and adhesion is accomplished more intimately.

In order to enhance the sintering property and to decrease the residual stress during the firing, further, it is desired to add the cordierite powder at a ratio of from 20 to 40% by weight and, particularly, from 25 to 35% by weight.

Here, the alkaline earth metals which are the sub-components are in the form of powders of oxides of Mg, Ca, Sr and Ba, and the glass powder is a non-lead•non-alkaline borosilicate glass powder.

Use is made of the non-lead•non-alkaline borosilicate glass powder because of the reason that lead causes an extreme burden on the environment and the alkali causes a defect in the insulation among the wirings. As such a glass powder, there can be used the one of the Si—Al—B—O type, Si—B—Ca—O type or Si—Al—B—Mg—Zn—O type.

Here, the forsterite powder and the cordierite powder may be at least partly substituted by MgO, $Al_2O_3$, $SiO_2$ and composite oxide thereof so as to obtain a composition that precipitates forsterite and cordierite.

In adding the above oxides, further, there may be further added carbonates, nitrates or acetates capable of forming oxides upon firing in addition to adding the oxide powders.

Next, to the above-mentioned starting material powders for producing the alumina layers 1 and the low-dielectric layers 2, there is added a suitable amount of an organic solvent such as an organic binder like polyvinyl alcohol or polyacrylate, or an isopropyl alcohol or toluene to thereby prepare a slurry for molding. The slurry is then molded into a green sheet having a predetermined thickness for forming an alumina layer and into a green sheet for forming a low-dielectric layer relying upon a known molding method such as doctor blade method, reverse roll coater method, gravure coater method, screen-printing method or gravure-printing method.

In the green sheets are suitably formed through-holes for via-hole conductors by using a micro-drill or a laser depending upon the layer structure of the insulating board 10.

Next, an electrically conducting paste containing a predetermined low-resistance conductor and assistant metal components at predetermined ratios, is prepared depending upon the above-mentioned metallized composition.

In the case of the above-mentioned preferred embodiment, for example, a copper powder having an average particle diameter of from 1 to 10 $\mu$m is contained in an amount of from 10 to 70% by weight and, particularly, from 30 to 60% by weight, a tungsten powder and/or a molybdenum powder having an average particle diameter of from 1 to 10 $\mu$m is contained in an amount of from 30 to 90% by weight and, particularly, from 40 to 70% by weight and, as desired, at least one kind of Zr, Al, Li, Mg and Zn is contained in an amount of from 0.05 to 3.0% by weight and, particularly, from 0.2 to 2.0% by weight calculated as a metal element to thereby prepare an electrically conducting paste.

Here, when the amount of the copper powder is smaller than 10% by volume, the resistance of the conductor layers 3 becomes high and when the amount of the copper powder is not smaller than 70% by volume, it becomes difficult to maintain the shape during the co-firing of the alumina insulating layers 1, dielectric layers and conductor layers 3, permitting the occurrence of oozing and breakage, or causing the conductor layers 3 to be peeled off the alumina insulating layers 1 and/or the dielectric layers 2, and permitting metals to escape from the via-holes 4.

In order to enhance intimate adhesion to the alumina layers 1 and to the low-dielectric layers 2, as required, the electrically conducting paste may be blended with a powder of aluminum oxide, a crystalline powder of an oxide having a low dielectric constant or a powder of the same composition as the mixed powder of starting materials used for the formation of alumina layers 1 and low-dielectric layers 2 in an amount of from 0.05 to 3% by volume.

The electrically conducting paste prepared as described above is filled in the through-holes for via-hole conductors formed in the green sheet, and is applied in a pattern of the metallized wiring layers 3*a* to 3*c* by such a method as screen printing or gravure printing.

The green sheets onto which the electrically conducting paste is applied by printing and of which the through-holes are filled with the conducting paste, are positioned depending upon the layer structure of the object insulating board 10, laminated, and are press-adhered. The laminate is then fired (co-fired) in a non-oxidizing atmosphere at a temperature of from 1200 to 1500° C., preferably, from 1250 to 1450° C., more preferably, from 1250 to 1400° C. and, most particularly, from 1275 to 1350° C. to obtain the composite ceramic board of the present invention.

Here, when the firing temperature is lower than the above-mentioned range (1200° C.), the alumina layers 1 are not densely formed to possess a relative density of not smaller than 95% and, besides, the low-dielectric layers 2 are not densely formed, either. As a result, the obtained board exhibits decreased thermal conductivity and strength.

When the firing temperature is not lower than the above-mentioned range (1500° C.), the high-melting point conductors such as W and Mo added to the conducting paste are sintered, and the homogeneous composition of the conductor layers 3 is no longer maintained due to fluidization of low-resistance conductor component such as Cu and, besides, the low resistance is no longer maintained.

As the non-oxidizing atmosphere at the time of firing, it is desired to use a nitrogen atmosphere or a mixed atmosphere of nitrogen and hydrogen. In order to suppress the diffusion of low-resistance conductor such as Cu in the wiring layers, in particular, it is desired to use a non-oxidizing atmosphere which contains hydrogen and nitrogen and has a dew point of not higher than +30° C. and, particularly, from 0 to 25° C. as described earlier.

That is, when the dew point is not lower than +30° C. during the firing, the conductor material reacts with the water in the atmosphere during the firing to form an oxide film, and the alumina layers 1 react with the low-resistance conductor in the wiring layers interrupting the attempt for lowering the resistance of the conductors and, besides, assisting the diffusion of the low-resistance conductors.

As desired, the atmosphere may be mixed with an inert gas such as argon gas.

The above-mentioned method of producing the composite ceramic board is capable of simultaneously firing the alumina layers 1, low-dielectric layers 2 and conductor layers 3 having a small electric resistance, and makes it possible to easily realize a composite ceramic part which has a little loss of signals and is equipped with a highly strong and highly heat conducting insulating board.

Next, described below are an optical/electronic-mounted circuit substrate of the invention using the above-mentioned composite ceramic board and a mounted board mounting the above circuit substrate.

Figure 4:
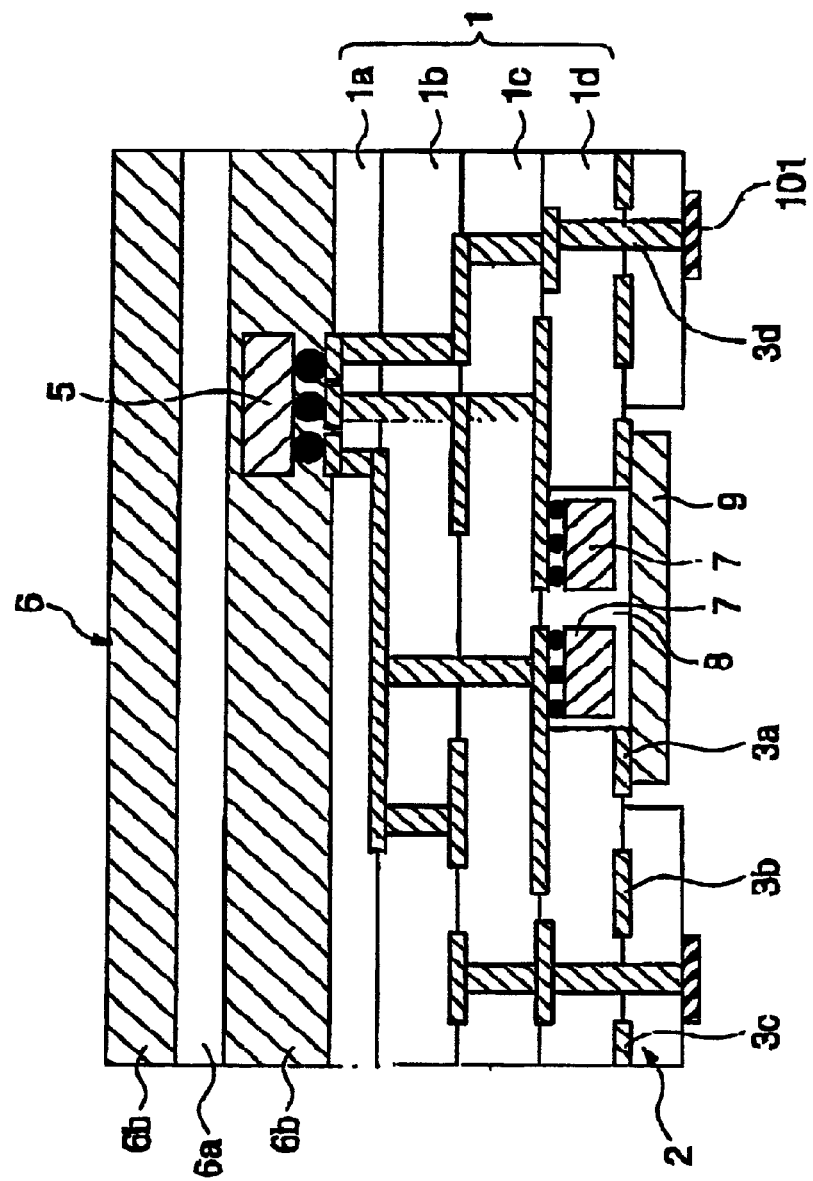
FIG. 4 is a sectional view schematically illustrating an optical/electronic-mounted circuit substrate of the present invention.

FIG. 4 is a sectional view schematically illustrating the optical/electronic-mounted circuit substrate of the present invention.

Namely, there are integrally laminated an alumina layer 1 of alumina sintered bodies 1*a* to 1*d* which are thin layers of a sintered body formed chiefly of alumina, and a low-dielectric layer 2 having a dielectric constant smaller than that of the alumina sintered bodies 1*a* to 1*d*.

The alumina layer 1 may be constituted by a single layer of alumina sintered body. From the standpoint of highly densely mounting the semiconductors, wirings and decreasing the size, however, it is desired that the alumina layer 1 is a laminate of a plurality of alumina sintered bodies 1*a* to 1*d*.

In FIG. 4, further, though the alumina layer 1 is constituted by four layers of alumina sintered bodies 1*a* to 1*d*, there is no particular limitation on the number of the alumina sintered bodies and their number may be suitably determined depending upon the amount of wiring, positions of the semiconductors and the like.

Surface conductor layers 3*a* and internal conductor layers 3*b* are formed on the surfaces or on the interfaces of the alumina sintered bodies 1*a* to 1*d* constituting the alumina layer 1, and a grounding conductor layer 3*c* is provided between the low-dielectric layer 2 and the alumina layer 1.

Via-hole conductors 3*d* are formed penetrating through a piece of or a plurality of pieces of alumina sintered bodies.

Namely, the conductor layers 3 are formed on the surface and/or inside of the board.

The constitution described up to this point in the same as the constitution of the above-mentioned composite ceramic board of the present invention.

In the optical/electronic-mounted circuit substrate of the present invention, an optical semiconductor device 5 is mounted and an optical waveguide 6 is formed on one surface side of the composite ceramic board. The optical waveguide 6 has a structure which is optically connected to the optical semiconductor element 5, and in which an optical waveguide clad 6*b* is provided surrounding an optical waveguide core 6*a*.

The optical waveguide 6 is present in at least a portion on one surface side of the alumina layer 1. The optical semiconductor device 5 may be positioned on the outer side of the optical waveguide 6. In order to enhance the reliability of the optical semiconductor device 5 and to prevent malfunctioning, however, it is desired that the optical semiconductor device 5 is provided on the inside of the optical waveguide 6.

In the optical/electronic-mounted circuit substrate of the present invention, further, it is desired that an electronic semiconductor device 7 is mounted on the other surface of the alumina layer 1.

That is, the electronic semiconductor device 7 and the optical semiconductor device 5 are mounted on the opposing surfaces of the board.

Being constituted as described above, a number of electronic semiconductor devices 7 and optical semiconductor devices 5 can be mounted on a single board to decrease the size of the product based on the highly dense mounting and to increase the reliability.

Here, the low-dielectric layer 2 may be integrally laminated on the whole surface of the alumina sintered body 1*d* constituting the ceramic board. As shown in FIG. 4, however, the low-dielectric layer 2 may be formed on a portion of the alumina sintered body 1d.

Due to this constitution, the surface of the alumina layer 1, too, is exposed on the surface of the ceramic board on the side of the low-dielectric layer 2 permitting the electronic semiconductor device to be mounted thereon to enhance the mounting density.

It is also possible to mount the electronic semiconductor device 7 on the surface on one side of the alumina layer 1 on where the optical semiconductor element and optical waveguide are provided.

Namely, the optical waveguide 6 may be formed on a potion of the surface, and the electronic semiconductor device 7 may be mounted on the surface on where the optical waveguide 6 has not been provided.

The electronic semiconductor device 7 is held in a cavity 8 formed in the surface of the board, and is mounted on the surface of the alumina sintered body 1d by soldering based upon ball mounting and/or bear-chip mounting.

The cavity 8 is air-tightly sealed with a cap 9, and no external air enters into the cavity 8. Therefore, the electronic semiconductor device 7 is prevented from malfunctioning and reliability is improved.

Moreover, an external connection terminal 101 is provided on the surface of the low-dielectric layer 2.

The external connection terminal 101 is for receiving high-frequency signals from an external unit, and is electrically connected to an external circuit.

Since the external connection terminal 101 is formed on the low-dielectric layer 2 having a low dielectric constant, a stray capacity generates little between the external connection terminal 101 and the internal conductor layer 3b, whereby the reflection of input signals is suppressed and the signal loss decreases. As a result, there is realized the optical/electronic-mounted circuit substrate capable of coping with high-frequency signals.

The alumina layer 1 comprises a single or a plurality of alumina sintered bodies.

In order to increase the mounting density, it is desired to use a plurality of alumina sintered bodies in a laminated form.

In is further desired that the conductor layers 3 have a sheet resistance of not larger than 8 mΩ/□ calculated as having a thickness of 15 µm.

This low sheet resistance makes it possible to decrease the width of the wiring and to decrease the size.

Next, described below is a method of producing the optical/electronic-mounted circuit substrate of the present invention.

First, the composite ceramic board of the present invention is prepared by the method described above (production of the ceramic board), and the optical waveguide is formed on the surface of the board.

The optical waveguide is formed on the surface of the board as described below. That is, a silica optical waveguide is formed on the alumina insulating layer by a sol-gel method, or an optical waveguide is formed by using an organic material such as polyimide, polymethyl methacrylate or polycarbonate, or an optical waveguide is formed based on a CVD method.

Next, the optical semiconductor device is placed on the alumina layer, is electrically connected to a conducting layer of the board and is, at the same time, buried in the optical waveguide clad.

The optical waveguide is formed on the alumina layer because the layer forming the optical waveguide is highly strong, the connection reliability is excellent since the coefficient of thermal expansion of the element optically connected to the optical waveguide is close to that of alumina, and heat generated by the semiconductor device is excellently conducted.

Next, the electronic semiconductor device is arranged. Here, it is desired that the electronic semiconductor device is placed on the surface of the insulating layer of alumina. This is because alumina has a relatively high thermal conductivity unlike glass ceramics and, hence, efficiently and quickly radiates the heat generated by the device.

Besides, unlike the resin board such as of polyimide, alumina has a coefficient of thermal expansion close to that of the semiconductor device and assures a highly reliable primary mounting.

In this case, the semiconductor device can be mounted on the board relying upon the ball mounting and/or the bear-chip mounting by using a solder.

The mounted board of the present invention has an electronic circuit including capacitors, resistors and wiring conductors formed on the surface of the printed substrate such as mother board, and the above-mentioned optical/electronic-mounted circuit substrate is mounted on the electronic circuit through external connection terminals 101.

According to the present invention, the optical/electronic-mounted circuit substrate of the above-mentioned constitution is used as the mounted board, and the reflection loss of when high-frequency signals of 40 GHz are input to the optical/electronic-mounted circuit substrate is suppressed to be not larger than −10.0 dB, particularly, not larger than −7 dB and, more particularly, not larger than −5 dB.

Therefore, use of the optical/electronic-mounted circuit substrate makes it possible to receive high-frequency signals of not lower than 40 GHz to cope with the optical communication of a large capacity.

EMBODIMENTS (Experiment 1)

A mixed powder was obtained by adding, to an aluminum oxide powder (average particle diameter of 1.8 µm), 6% by weight of $Mn_2O_3$, 6% by weight of $SiO_2$ and 0.5% by weight of MgO (the amounts of addition are all per the whole amount of the mixed powder).

To the above mixed powder were further mixed an acrylic binder and toluene to prepare a slurry thereof which was, then, molded into a green sheet for forming inner insulating layers (correspond to the alumina layers of the invention) having a thickness of 250 µm by the doctor blade method.

By using mullite, forsterite, enstatite, silica, cordierite and alumina as chief components, further, the second components were prepared by mixing the chief components at ratios as shown in Table 1. The mixed powders were then molded into green sheets for forming the outer electrode-forming layer (corresponds to the low-dielectric layer of the present invention) having a thickness of 250 µm in the same manner as described above.

As a glass of the second component, there was used a crystallized glass of borosilicate.

In Table 1, $Mn_2O_3/SiO_2$ shown as the second component means that $Mn_2O_3$ and $SiO_2$ were used in an equal amount.

Through-holes for forming via-hole conductors were formed in the thus obtained green sheets at predetermined portions, the through-holes having a diameter of 100 to 200 µm after firing. Next, a copper powder having an average particle diameter of 5 µm and a tungsten powder having an average particle diameter of from 0.8 to 12 µm were mixed at a volume ratio of 1:1, and to which were added an acrylic binder and acetone as a solvent to prepare an electrically conducting paste.

The above electrically conducting paste was applied onto the green sheets that have been obtained as described above, and was further filled in the through-holes in the sheets.

The thus prepared sheets were positioned, laminated and press-adhered to obtain molded laminate sheets. The laminate sheets were dewaxed in an oxygen-containing atmosphere ($H_2+O_2$) without substantially containing water, fired in a nitrogen-hydrogen mixed atmosphere having a dew point of 20° C. at a temperature shown in Table 1 to obtain wiring boards (samples Nos. 1 to 13).

The obtained wiring boards were measured concerning the electric resistances of the conductor layers, reflection losses, flexural strengths of the boards and thermal conductivities by the methods described below, and the results were as shown in Table 2.

The electric resistances of the conductor layers (calculated as sheet resistances of a thickness of 15 μm) were measured by a four-terminal method.

The reflection losses were measured at 40 GHz by using a network analyzer and a water probe.

Concretely speaking, the values were measured between the Teflon substrate mounting the sample board and the electrode for measurement provided on the sample board.

Figure 3:
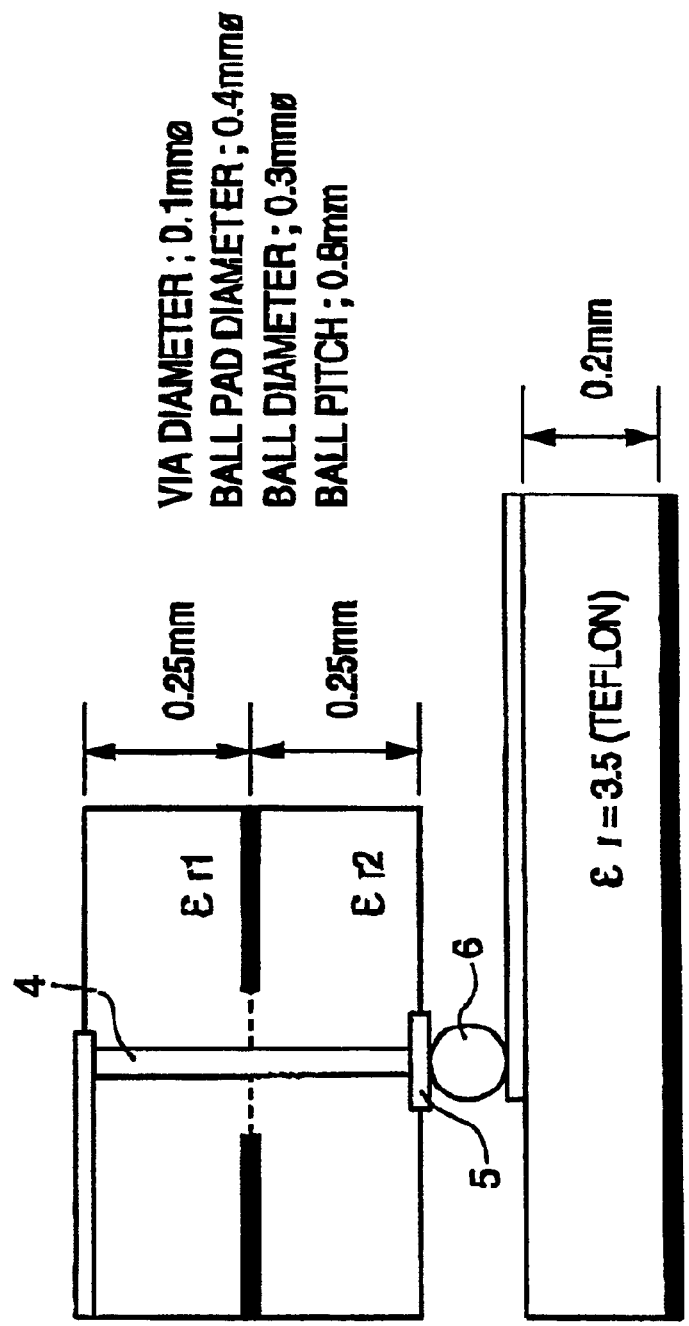
FIG. 3 is a sectional view schematically illustrating a laminate structure of a sample board used for the measurement of reflection losses in Experiments 1 and 2.

FIG. 3 is a sectional view illustrating the constitution of the sample being measured (the low-dielectric layer provided with a terminal for receiving signals possessed a thickness of 0.25 mm, the alumina layer possessed a thickness of 0.25 mm, the via-hole 4 possessed a diameter of 0.1 mm, the electrode pad 5 (ball pad) possessed a diameter of 0.4 mm, the solder ball 6 possessed a diameter of 0.3 mm, the ball pitch (distance between centers of the neighboring solder balls 6) was 0.8 mm, and the Teflon board mounting the sample board possessed a thickness of 0.2 mm and a dielectric constant of 3.5).

The sample board for measuring the flexural strength was adjusted for its number of the laminated layers so that the low-dielectric layer forming the external electrode possessed a total thickness of 0.5 mm, the alumina layers possessed a total thickness of 2.5 mm, and was evaluated in terms of a three-point bending strength.

The thermal conductivity, too, was measured by using the sample board having the same laminate structure relying upon the laser flash method at room temperature.

(Experiment 2)

Wiring boards were produced (samples Nos. 14 to 17 and 20, 21) in the same manner as in Experiment 1 but changing the electrically conducting paste (metallizing composition) as shown in Table 1 (when two kinds of conductors were used, the volume ratio was all 1:1), and were measured in the same manner as in Experiment 1.

Further, the wiring boards were produced (samples Nos. 18 and 19) in the same manner as in Experiment 1 but changing the composition of the inner insulating layers (correspond to the alumina layers of the invention) or of the outer electrode-forming layer as shown in Table 1, and were measured in the same manner as in Experiment 1.

The results were as shown in Table 2.

TABLE 1

| | Inner insulating layer ($Al_2O_3$ layer) | | | Outer electrode-forming layer (low-dielectric layer) | | | Firing | |
|---|---|---|---|---|---|---|---|---|
| No. | Main component | Amount (wt %) | 2nd component | Main component | Amount (wt %) | 2nd component | temperature (° C.) | Metallising composition |
| 1 | $Al_2O_3$ | 67 | $Mn_2O_3/SiO_2$ | $Al_2O_3$ | 87 | $Mn_2O_3/SiO_2$ | 1300 | Cu + W |
| 2 | $Al_2O_3$ | 87 | $Mn_2O_3/SiO_2$ | forsterite | 85 | $Mn_2O_3/SiO_2$ | 1300 | Cu + W |
| 3 | $Al_2O_3$ | 87 | $Mn_2O_3/SiO_2$ | forsterite | 80 | glass | 1300 | Cu + W |
| 4 | $Al_2O_3$ | 87 | $Mn_2O_3/SiO_2$ | enstatite | 80 | glass | 1300 | Cu + W |
| 5 | $Al_2O_3$ | 87 | $Mn_2O_3/SiO_2$ | enstatite | 70 | glass | 1300 | Cu + W |
| 6 | $Al_2O_3$ | 87 | $Mn_2O_3/SiO_2$ | forsterite | 70 | $SiO_2$ | 1300 | Cu + W |
| 7 | $Al_2O_3$ | 87 | $Mn_2O_3/SiO_2$ | enstatite | 70 | $SiO_2$ | 1300 | Cu + W |
| 8 | $Al_2O_3$ | 87 | $Mn_2O_3/SiO_2$ | forsterite | 70 | cordierite | 1300 | Cu + W |
| 9 | $Al_2O_3$ | 87 | $Mn_2O_3/SiO_2$ | forsterite | 60 | cordierite | 1300 | Cu + W |
| 10 | $Al_2O_3$ | 87 | $Mn_2O_3/SiO_2$ | $SiO_2$ | 60 | enstatite | 1300 | Cu + W |
| 11 | $Al_2O_3$ | 87 | $Mn_2O_3/SiO_2$ | cordierite | 70 | $SiO_2$ | 1300 | Cu + W |
| 12 | $Al_2O_3$ | 87 | $Mn_2O_3/SiO_2$ | $SiO_2$ | 60 | cordierite | 1300 | Cu + W |
| 13 | $Al_2O_3$ | 87 | $Mn_2O_3/SiO_2$ | $SiO_2$ | 85 | glass | 1300 | Cu + W |
| 14 | $Al_2O_3$ | 87 | $Mn_2O_3/SiO_2$ | forsterite | 70 | cordierite | 1300 | Cu + Mo |
| 15 | $Al_2O_3$ | 87 | $Mn_2O_3/SiO_2$ | forsterite | 70 | cordierite | 1300 | Ag + W |
| 16 | $Al_2O_3$ | 87 | $Mn_2O_3/SiO_2$ | forsterite | 70 | cordierite | 1300 | Ag + W |
| 17 | $Al_2O_3$ | 87 | $Mn_2O_3/SiO_2$ | forsterite | 70 | cordierite | 1300 | Pt + W |
| *18 | forsterite | 70 | cordierite | $Al_2O_3$ | 87 | $Mn_2O_3/SiO_2$ | 1300 | Cu + W |
| *19 | forsterite | 70 | cordierite | forsterite | 70 | cordierite | 1300 | Cu + W |
| *20 | $Al_2O_3$ | 87 | $Mn_2O_3/SiO_2$ | forsterite | 70 | cordierite | 1300 | W |
| *21 | $Al_2O_3$ | 87 | $Mn_2O_3/SiO_2$ | forsterite | 70 | cordierite | 1300 | Mo |

A mark * represents Comparative Examples

TABLE 2

| | Dielectric constant | | | | | | |
|---|---|---|---|---|---|---|---|
| No. | Inner insulating layer | Low-dielectric layer | Sheet resistance | Reflection loss (dB) | Flexural strength (MPa) | Thermal conductivity (W/m.k) | Remarks |
| *1 | 9 | 9 | <8 | −6.4 | 400 | 16 | |
| 2 | 9 | 8 | <8 | −10 | 384 | 15 | |

TABLE 2-continued

| | Dielectric constant | | | | | | |
|---|---|---|---|---|---|---|---|
| No. | Inner insulating layer | Low-dielectric layer | Sheet resistance | Reflection loss (dB) | Flexural strength (MPa) | Thermal conductivity (W/m.k) | Remarks |
| 3 | 9 | 7.1 | <8 | −11.5 | 380 | 15 | |
| 4 | 9 | 6.8 | <8 | −13.6 | 369 | 15 | |
| 5 | 9 | 6.6 | <8 | −14 | 350 | 15 | |
| 6 | 9 | 6.4 | <8 | −14.3 | 376 | 15 | |
| 7 | 9 | 6.2 | <8 | −13.5 | 370 | 14 | |
| 8 | 9 | 5 | <8 | −15 | 385 | 14 | |
| 9 | 9 | 5.8 | <8 | −15.4 | 346 | 13 | |
| 10 | 9 | 5.6 | <8 | −16 | 360 | 14 | |
| 11 | 9 | 5.4 | <8 | −18 | 341 | 12 | |
| 12 | 9 | 5.2 | <8 | −19.7 | 350 | 13 | |
| 13 | 9 | 5 | <8 | −21.9 | 343 | 14 | |
| 14 | 9 | 6 | <8 | −15 | 385 | 14 | |
| 15 | 9 | 6 | <8 | −15 | 385 | 14 | |
| 16 | 9 | 6 | <8 | −15 | 385 | 14 | |
| 17 | 9 | 6 | <8 | −15 | 385 | 14 | |
| *18 | 6 | 9 | <8 | −6.3 | 215 | 3 | |
| *19 | 6 | 6 | <8 | −15 | 197 | 2 | |
| *20 | 9 | 6 | 32 | −15 | 385 | 14 | insertion loss increased |
| *21 | 9 | 6 | 28 | −15 | 385 | 14 | insertion loss increased |

A mark * represents Comparative Examples (Experiment 3)

As alumina layers, there were mixed an alumina powder (average particle diameter of 1.8 μm), an $Mn_2O_3$ powder, an $SiO_2$ powder, an MgO powder, a CaO powder, an SrO powder, a $B_2O_5$ powder, an $Nb_2O_5$ powder, a $Cr_2O_3$ powder and a $CoO_3$ powder in amounts as shown in Table 3, and to which were mixed, as an organic resin for molding (binder), an acrylic binder and toluene as a solvent, to prepare a slurry thereof which was, then, molded into a sheet having a thickness of 250 μm by the doctor blade method.

Via-holes were formed in the sheet at predetermined portions so as to possess a diameter of 100 to 200 μm after firing.

As low-dielectric layer, further, there were mixed a forsterite powder, a cordierite powder, a $Zn_2SiO_4$ powder, an $Mn_2O_3$ powder, a CaO powder, an MgO powder, a BaO powder and a non-lead•non-alkaline borosilicate glass powder in amounts as shown in Table 3, and to which were mixed, as an organic resin for molding (binder), an acrylic binder and toluene as a solvent, to prepare a slurry thereof.

The slurries were molded into sheets having a thickness of 250 μm by the doctor blade method, and via-holes were formed therein at predetermined portions so as to possess a diameter of 100 to 200 μm after firing.

Next, a copper powder having an average particle diameter of 5 μm and a tungsten powder or a molybdenum powder having an average particle diameter of 5 μm were mixed at ratios shown in Table 3, followed by the addition of an acrylic binder and acetone as a solution to prepare an electrically conducting paste.

Then, the above electrically conducting paste was printed and applied onto the sheet-like molded articles and was filled in the via-holes 4 in the sheet-like molded articles.

The thus produced sheet-like molded articles were positioned, laminated and press-adhered to prepare molded laminates.

Thereafter, the molded laminates were dewaxed in an oxygen-containing atmosphere without substantially containing water, and were fired at firing temperatures shown in Table 3 in a nitrogen-hydrogen mixed atmosphere having a dew point of 25° C. to produce composite ceramic boards as shown in FIG. 2.

The obtained sintered bodies were measured for their specific gravities by Archimedes's method, and relative densities were calculated from the true specific gravities.

The thus produced composite ceramic boards were observed for their warping od cracks, and were further observed to make sure the appearance of the wirings and via-holes.

The thermal conductivities were measured based on the laser flashing method in compliance with JIS R 1611.

The dielectric constants were measured at a frequency of 60 GHz by the cavity resonator method in compliance with JIS R 1627.

Further, the alumina insulating layers were measured for their three-point bending strengths at room temperature in compliance with JIS R 1601.

The contents of forsterite and cordierite were measured based on the X-ray diffraction and Liedbert's analysis.

The reflection losses for the signals of 60 GHz were measured by using a network analyzer and a wafer probe.

If described in detail, the values were measured between the board mounting the ceramic board and the electrode for measurement provided in the ceramic board.

The results were as shown in Tables 3 and 4.

TABLE 3

| | Composition of insulating layer | | | | | Composition of dielectric layer | | | | | | Composition of conductor layer | | |
|---|---|---|---|---|---|---|---|---|---|---|---|---|---|---|
| | | | | Additive | | For-sterite | Cor-dierite | | Alkaline earth metal | | Boro-silicate | | High-melting metal | |
| No. | Al$_2$O$_3$ (wt %) | Mn$_2$O$_3$ (wt %) | SiO$_2$ (wt %) | Kind | Content (wt %) | (wt %) | (wt %) | Mn$_2$O$_3$ (wt %) | Kind | Content (wt %) | Zr$_2$SiO$_4$ (wt %) | glass (wt %) | Cu vol % | Kind | Content (vol %) |
| 22 | 91.5 | 5 | 3 | MgO | 0.5 | 75.0 | 20.0 | 4.0 | CaO | 1.0 | — | — | 55 | W | 45 |
| 23 | 91.5 | 5 | 3 | MgO | 0.5 | 62.5 | 32.5 | 4.0 | CaO | 1.0 | — | — | 55 | W | 45 |
| 24 | 91.5 | 5 | 3 | MgO | 0.5 | 55.0 | 40.0 | 4.0 | CaO | 1.0 | — | — | 55 | W | 45 |
| 25 | 91.5 | 5 | 3 | MgO | 0.5 | 64.5 | 33.5 | 1.6 | CaO | 0.4 | — | — | 55 | W | 45 |
| 26 | 91.5 | 5 | 3 | MgO | 0.5 | 69.2 | 30.8 | 8.0 | CaO | 2.0 | — | — | 55 | W | 45 |
| 27 | 91.5 | 5 | 3 | MgO | 0.5 | 62.5 | 32.5 | 5.0 | CaO | — | — | — | 55 | W | 45 |
| 28 | 91.5 | 5 | 3 | MgO | 0.5 | 62.5 | 32.5 | 0.0 | CaO | 5.0 | — | — | 55 | W | 45 |
| 29 | 91.5 | 5 | 3 | MgO | 0.5 | 62.5 | 32.5 | 0.0 | CaO | — | 5.0 | — | 55 | W | 45 |
| 30 | 91.5 | 5 | 3 | MgO | 0.5 | 62.5 | 32.5 | 0.0 | CaO | — | — | 5.0 | 55 | W | 45 |
| 31 | 91.5 | 5 | 3 | MgO | 0.5 | 64.5 | 33.5 | 0.8 | CaO | 0.2 | — | 1.0 | 55 | W | 45 |
| 32 | 91.5 | 5 | 3 | MgO | 0.5 | 62.5 | 32.5 | 2.4 | CaO | 0.6 | — | 2.0 | 55 | W | 45 |
| 33 | 91.5 | 5 | 3 | MgO | 0.5 | 59.2 | 30.8 | 4.8 | CaO | 1.2 | — | 4.0 | 55 | W | 45 |
| 34 | 91.5 | 5 | 3 | MgO | 0.5 | 54.5 | 33.5 | 0.8 | CaO | 0.2 | 1.0 | — | 55 | W | 45 |
| 35 | 91.5 | 5 | 3 | MgO | 0.5 | 52.5 | 32.5 | 2.4 | CaO | 0.5 | 2.0 | — | 55 | W | 45 |
| 36 | 91.5 | 5 | 3 | MgO | 0.5 | 59.2 | 30.8 | 4.8 | CaO | 1.2 | 4.0 | — | 55 | W | 45 |
| 37 | 91.5 | 5 | 3 | MgO | 0.5 | 62.5 | 32.5 | 4.0 | CaO | 1.0 | — | — | 55 | W | 45 |
| 38 | 91.5 | 5 | 3 | MgO | 0.5 | 62.5 | 32.5 | 4.0 | CaO | 1.0 | — | — | 55 | W | 45 |
| 39 | 91.5 | 5 | 3 | MgO | 0.5 | 62.5 | 32.5 | 4.0 | CaO | 1.0 | — | — | 55 | W | 45 |
| 40 | 91.5 | 5 | 3 | MgO | 0.5 | 62.5 | 32.5 | 4.0 | MgO | 1.0 | — | — | 55 | W | 45 |
| 41 | 91.5 | 5 | 3 | MgO | 0.5 | 62.5 | 32.5 | 4.0 | SrO | 1.0 | — | — | 55 | W | 45 |
| 42 | 91.5 | 5 | 3 | MgO | 0.5 | 62.5 | 32.5 | 4.0 | BaO | 1.0 | — | — | 55 | W | 45 |
| 43 | 97.5 | 2 | 0 | MgO | 0.5 | 62.5 | 32.5 | 4.0 | CaO | 1.0 | — | — | 55 | W | 45 |
| 44 | 89.5 | 10 | 0 | MgO | 0.5 | 62.5 | 32.5 | 4.0 | CaO | 1.0 | — | — | 55 | W | 45 |
| 45 | 84.5 | 15 | 0 | MgO | 0.5 | 62.5 | 32.5 | 4.0 | CaO | 1.0 | — | — | 55 | W | 45 |
| 46 | 91.5 | 0 | 5 | MgO | 0.5 | 62.5 | 32.5 | 4.0 | CaO | 1.0 | — | — | 55 | W | 45 |
| 47 | 89.5 | 0 | 10 | MgO | 0.5 | 62.5 | 32.5 | 4.0 | CaO | 1.0 | — | — | 55 | W | 45 |
| 48 | 84.5 | 0 | 15 | MgO | 0.5 | 62.5 | 32.5 | 4.0 | CaO | 1.0 | — | — | 55 | W | 45 |
| 49 | 91.9 | 5 | 3 | MgO | 0.0 | 62.5 | 32.5 | 4.0 | CaO | 1.0 | — | — | 55 | W | 45 |
| 50 | 90.0 | 5 | 3 | MgO | 2.0 | 62.5 | 32.5 | 4.0 | CaO | 1.0 | — | — | 55 | W | 45 |
| 51 | 88.0 | 5 | 3 | MgO | 4.0 | 62.5 | 32.5 | 4.0 | CaO | 1.0 | — | — | 55 | W | 45 |
| 52 | 91.5 | 5 | 3 | CaO | 0.5 | 62.5 | 32.5 | 4.0 | CaO | 1.0 | — | — | 55 | W | 45 |
| 53 | 91.5 | 5 | 3 | B$_2$O$_5$ | 0.5 | 62.5 | 32.5 | 4.0 | CaO | 1.0 | — | — | 55 | W | 45 |
| 54 | 91.5 | 5 | 3 | Mn$_2$O$_5$ | 0.5 | 62.5 | 32.5 | 4.0 | CaO | 1.0 | — | — | 55 | W | 45 |
| 55 | 91.5 | 5 | 3 | Cr$_2$O$_5$ | 0.5 | 62.5 | 32.5 | 4.0 | CaO | 1.0 | — | — | 55 | W | 45 |
| 56 | 91.5 | 5 | 3 | CoO$_3$ | 0.5 | 62.5 | 32.5 | 4.0 | CaO | 1.0 | — | — | 55 | W | 45 |
| 57 | 91.5 | 5 | 3 | MgO | 0.5 | 62.5 | 32.5 | 4.0 | CaO | 1.0 | — | — | 10 | W | 90 |
| 58 | 91.5 | 5 | 3 | MgO | 0.5 | 62.5 | 32.5 | 4.0 | CaO | 1.0 | — | — | 40 | W | 60 |
| 59 | 91.5 | 5 | 3 | MgO | 0.5 | 62.5 | 32.5 | 4.0 | CaO | 1.0 | — | — | 70 | W | 30 |
| 60 | 91.5 | 5 | 3 | MgO | 0.5 | 62.5 | 32.5 | 4.0 | CaO | 1.0 | — | — | 55 | Mo | 45 |
| 61* | 31.5 | 5 | 3 | MgO | 0.5 | 65.8 | 34.2 | 0.0 | — | — | — | — | 55 | W | 45 |

Sample marked with * is that outside the scope of the invention

TABLE 4

| | | | | Properties | | | | |
|---|---|---|---|---|---|---|---|---|
| Sample No. | Firing temperature (° C.) | Relative density of insulating layer (%) | Main crystal phase of dielectric layer | Dielectric constant | Strength of insulating layer (MPa) | Appearance of wiring via-holes | Warping and cracks of board | Reflection loss (db) |
| 22 | 1350 | 97 | F,C | 6.5 | 472 | good | no | −12.5 |
| 23 | 1350 | 97 | F,C | 5.9 | 472 | good | no | −14.3 |
| 24 | 1350 | 97 | F,C | 5.5 | 472 | good | no | −15.5 |
| 25 | 1350 | 97 | F,C | 6.1 | 472 | good | no | −14.0 |
| 26 | 1350 | 97 | F,C | 5.8 | 472 | good | no | −14.8 |
| 27 | 1350 | 97 | F,C | 6.2 | 472 | good | no | −13.5 |
| 28 | 1350 | 97 | F,C | 6.0 | 472 | good | no | −14.0 |
| 29 | 1350 | 97 | F,C,W | 6.2 | 472 | good | no | −13.5 |
| 30 | 1350 | 97 | F,C,E | 5.8 | 472 | good | no | −14.8 |
| 31 | 1350 | 97 | F,C,E | 6.1 | 472 | good | no | −13.8 |
| 32 | 1350 | 97 | F,C,E | 5.9 | 472 | good | no | −14.5 |
| 33 | 1350 | 97 | F,C,E | 5.9 | 472 | good | no | −14.8 |
| 34 | 1350 | 97 | F,C,W | 6.1 | 472 | good | no | −13.8 |
| 35 | 1350 | 97 | F,C,W | 5.9 | 472 | good | no | −14.5 |
| 36 | 1350 | 97 | F,C,W | 5.8 | 472 | good | no | −14.8 |

TABLE 4-continued

|  |  | Relative | Main crystal |  |  |  | Properties |  |
|  |  |  |  |  |  |  | Warping | Reflec- |
|  | Firing | density of | phase of |  | Strength of | Appearance | and | tion |
| Sample | temperature | insulating | dielectric | Dielectric | insulating | of wiring | cracks | loss |
| No. | (° C.) | layer (%) | layer | constant | layer (MPa) | via-holes | of board | (db) |
| --- | --- | --- | --- | --- | --- | --- | --- | --- |
| 37 | 1200 | 96 | F,C | 5.8 | 440 | good | no | −14.8 |
| 38 | 1400 | 97 | F,C | 6.1 | 470 | good | no | −13.8 |
| 39 | 1500 | 97 | F,C | 6.1 | 468 | good | no | −13.8 |
| 40 | 1350 | 97 | F,C | 6.0 | 472 | good | no | −14.0 |
| 41 | 1350 | 97 | F,C | 6.1 | 472 | good | no | −13.8 |
| 42 | 1350 | 97 | F,C | 6.2 | 472 | good | no | −13.5 |
| 43 | 1350 | 93 | F,C | 6.0 | 220 | good | no | −14.0 |
| 44 | 1350 | 91 | F,C | 6.0 | 213 | good | no | −14.1 |
| 45 | 1350 | 90 | F,C | 6.0 | 210 | good | no | −14.1 |
| 46 | 1350 | 88 | F,C | 6.0 | 170 | good | no | −14.3 |
| 47 | 1350 | 87 | F,C | 6.0 | 150 | good | no | −14.3 |
| 48 | 1350 | 85 | F,C | 6.0 | 133 | good | no | −14.5 |
| 49 | 1350 | 96 | F,C | 6.0 | 489 | good | no | −14.1 |
| 50 | 1350 | 97 | F,C | 6.0 | 460 | good | no | −13.8 |
| 51 | 1350 | 97 | F,C | 6.0 | 432 | good | no | −13.9 |
| 52 | 1350 | 95 | F,C | 6.0 | 456 | good | no | −14.0 |
| 53 | 1350 | 97 | F,C | 6.0 | 463 | good | no | −14.3 |
| 54 | 1350 | 95 | F,C | 6.0 | 448 | good | no | −13.0 |
| 55 | 1350 | 96 | F,C | 6.0 | 460 | good | no | −13.5 |
| 56 | 1350 | 96 | F,C | 6.0 | 455 | good | no | −13.8 |
| 57 | 1350 | 97 | F,C | 6.0 | 472 | good | no | −13.2 |
| 58 | 1350 | 97 | F,C | 6.0 | 472 | good | no | −13.9 |
| 59 | 1350 | 97 | F,C | 6.0 | 472 | good | no | −14.5 |
| 60 | 1350 | 97 | F,C | 6.0 | 472 | good | no | −14.2 |
| *61 | 1350 | 97 | F,C | 6.3 | 472 | — | yes | — |

Sample marked with * is that outside the scope of the invention

The boards of samples Nos. 22 to 60 all exhibited good appearance of wirings and via-holes without warping or cracks, and having reflection losses of not larger than −12.5 dB.

The sample Nos. 61 without sub-components was warped to some extent.

(Experiment 4)

In order to form alumina layers, an aluminum oxide powder (average particle diameter of 1.8 μm) was added with 6% by weight of $Mn_2O_3$, 6% by weight of $SiO_2$ and 0.5% by weight of MgO, followed by the addition of an acrylic binder as an organic resin that works as a binder and toluene to prepare a slurry thereof which was, then, molded into a green sheet having a thickness of 250 μm by the doctor blade method.

Figure 5:
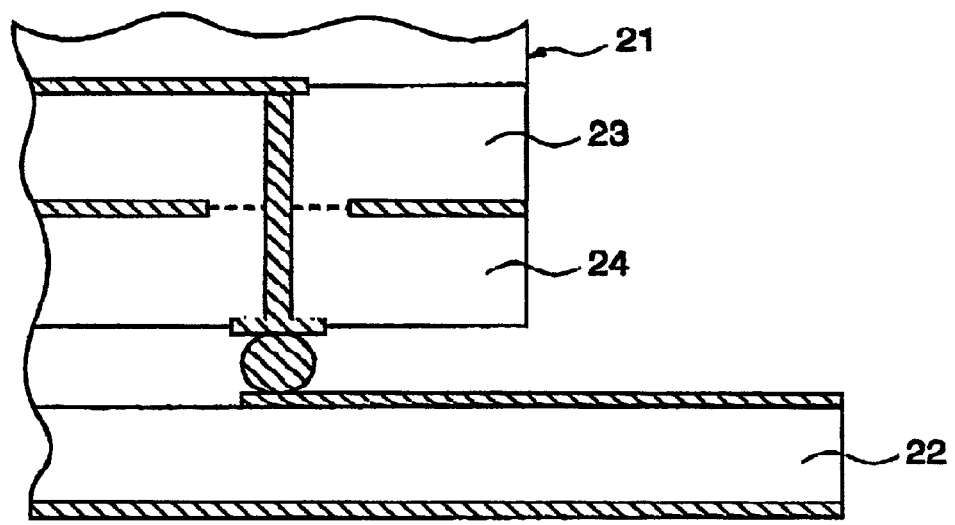
FIG. 5 is a sectional view schematically illustrating a portion of the mounted board according to the present invention.

In order to form a low-dielectric layer, further, one or more of those selected from mullite, forsterite, enstatite, silica and cordierite were used as chief components and to which were added additives shown in FIG. 5 to prepare a sheet-like molded article.

The dielectric constant of the low-dielectric layer was adjusted by adjusting the amount of silica.

Via-holes were formed therein at predetermined portions so as to possess a diameter of 100 to 200 μm after firing.

Next, one of a copper powder having an average particle diameter of 5 μm, a silver powder, a gold powder or a platinum powder, and a tungsten powder having an average particle diameter of 0.8 to 12 μm or a molybdenum powder were mixed together at ratios shown in Table 5, and to which were added an acrylic binder and acetone as a solvent to prepare an electrically conducting paste.

The electrically conducting paste was printed and applied onto the sheet-like molded articles, and was further filled in the via-holes in the sheet-like molded articles.

The thus prepared sheet-like molded articles were positioned, laminated and press-adhered to obtain molded laminates.

The molded laminates were, then, dewaxed in an oxygen-containing atmosphere ($H_2+O_2$) without substantially containing water, and were fired in a nitrogen-hydrogen mixed atmosphere having a dew point of 20° C. at a temperature 1300° C. to obtain optical/electronic-mounted circuit substrates shown in FIG. 4.

The obtained circuit substrates were measured for their densities by Archimedes' method.

The electric resistances of the conductor layers (calculated as sheet resistances) in the circuit substrate were measured by a four-terminal method.

The dielectric constants were measured at a frequency of 40 GHz by the cavity resonator method in compliance with JIS R 1627.

The reflection losses were measured at 40 GHz by using a network analyzer and a wafer probe.

Concretely speaking, the values were measured between the mother board 22 mounting the optical/electronic-mounted circuit substrate 21 and the electrode for measurement provided in the optical/electronic-mounted circuit substrate 21.

The low-dielectric layer having an external connection terminal formed on the surface thereof possessed a thickness of 0.25 mm, the alumina layer possessed a thickness of 0.25 mm, and the via-hole possessed a diameter of 0.1 mm.

The electrode pad (ball pad) constituting the external connection terminal possessed a diameter of 0.4 mm, the solder ball possessed a diameter of 0.3 mm, the ball pitch was 0.8 mm, and the Teflon board having a thickness of 0.2 mm and a dielectric constant of 3.5 was used as the mother board for mounting the optical/electronic-mounted circuit substrate.

The ceramic layer was measured for its flexural strength by using a co-fired sample having a low-dielectric insulating layer of a thickness of 0.5 mm which was for forming an outer electrode and an insulating layer, other than the above insulating layer, of a thickness of 2.5 mm.

The thermal conductivity of the ceramic layer, too, was measured by using the sample having the laminate structure used for the measurement of flexural strength relying upon the laser flash method at room temperature.

TABLE 5

| | Low-dielectric layer | | | Composition of conductor layer | | | | Properties | | | | | |
| | Main component | | | Main component | | | | | | Dielectric constant | | Sheet | Reflection |
| No. | Kind | Amount (wt %) | Additive | Kind | Amount (wt %) | Kind | Amount (wt %) | Density (g/cm³) | Flexural strength (MPa) | Thermal conductivity (W/mK) | Insulating layer | Dielectric layer | resistance (nΩ/☐) | Loss (dB) |
|---|---|---|---|---|---|---|---|---|---|---|---|---|---|---|
| *62 | A | 87 | $Mn_2O_3/SiO_2$ | Cu | 40 | W | 60 | 3.7 | 400 | 16 | 9 | 9 | 5 | −6.4 |
| 63 | F | 35 | $Mn_2O_3/SiO_2$ | Cu | 40 | W | 60 | 3.5 | 384 | 15 | 9 | 8 | 5 | 10 |
| 64 | F | 30 | glass | Cu | 40 | W | 60 | 3.4 | 380 | 15 | 9 | 7.1 | 5 | −11.5 |
| 65 | E | 80 | glass | Cu | 40 | W | 60 | 3.4 | 369 | 15 | 9 | 6.8 | 5 | −13.6 |
| 66 | E | 70 | glass | Cu | 40 | W | 60 | 3.3 | 350 | 15 | 9 | 6.6 | 5 | −14 |
| 67 | F | 70 | $SiO_2$ | Cu | 40 | W | 60 | 3.3 | 376 | 15 | 9 | 6.4 | 6 | −14.3 |
| 68 | E | 70 | $SiO_2$ | Cu | 40 | W | 60 | 3.3 | 370 | 14 | 9 | 6.2 | 6 | −13.5 |
| 69 | F | 70 | C | Cu | 40 | W | 60 | 3.2 | 385 | 14 | 9 | 6 | 5 | −15 |
| 70 | F | 60 | C | Cu | 40 | W | 60 | 3.2 | 346 | 12 | 9 | 5.8 | 5 | −15.4 |
| 71 | S | 60 | E | Cu | 40 | W | 50 | 3.3 | 360 | 14 | 9 | 5.6 | 5 | −15 |
| 72 | C | 70 | $SiO_2$ | Cu | 40 | W | 50 | 3.2 | 341 | 12 | 9 | 5.4 | 6 | −13 |
| 73 | S | 60 | C | Cu | 40 | W | 50 | 3.5 | 350 | 13 | 9 | 5.2 | 5 | −19.7 |
| 74 | S | 85 | glass | Cu | 40 | W | 60 | 3.3 | 343 | 14 | 9 | 5 | 6 | −21.9 |
| 75 | F | 70 | C | Cu | 40 | Mo | 60 | 3.3 | 385 | 14 | 9 | 4.8 | 6 | −15 |
| 76 | F | 70 | C | Ag | 40 | W | 60 | 3.3 | 385 | 14 | 9 | 4.8 | 5 | −15 |
| 77 | F | 70 | C | An | 40 | W | 60 | 3.3 | 385 | 14 | 9 | 4.6 | 5 | −15 |
| 78 | F | 70 | C | Pt | 40 | W | 60 | 3.3 | 385 | 14 | 9 | 4.4 | 6 | −15 |
| 79 | M | 70 | C | Cu | 40 | W | — | 3.6 | 370 | 14 | 9 | 4.4 | 6 | −15 |
| *80 | A | 70 | $Mn_2O_3/SiO_2$ | W | 100 | — | — | 3.6 | 385 | 14 | 9 | 9 | 32 | −6.5 |
| *81 | A | 70 | $Mn_2O_3/SiO_2$ | Mo | 100 | — | — | 3.6 | 385 | 14 | 9 | 9 | 28 | −6.5 |

Samples marked with * are those outside the scope of the invention
A: alrmina B: enstatite C: cordierite F: forsterite S: silica M: mullite In the samples Nos. 68 and 84 of the present invention, the low-dielectric layers exhibited dielectric constants of 4.4 to 8, which were smaller than the dielectric constant 9 of the alumina layer, and exhibited reflection losses of not larger than −10 dB.

The sample No. 67 (not included in the scope of the invention) in which the alumina layer and the low-dielectric layer were formed of the same material, exhibited a reflection loss of −6.4 dB.

The samples Nos. 85 and 86 in which the conductor layers were formed of W or Mo lying outside the scope of the present invention, exhibited sheet resistances of not smaller than 28 mΩ/☐ and reflection losses of as large as −6.5 dB.

What we claim is:

1. A composite ceramic board wherein insulating layers of alumina ceramics and dielectric layers of ceramics having a dielectric constant smaller than that of said insulating layers, are laminated as a unitary structure, and conductor layers containing at least one kind of low resistance conductor selected from the group consisting of Au, Ag, Cu and Pt are formed on the surfaces and inside of the composite ceramic board.

2. A composite ceramic board according to claim 1, wherein said insulating layers and/or said dielectric layers comprise laminates.

3. A composite ceramic board according to claim 1, wherein said dielectric layer is formed at a position to be exposed on the surface of the board, and a conductor layer that serves as an electrode for receiving external signals is formed on the exposed portion.

4. A composite ceramic board according to claim 1, wherein said insulating layers further contain manganese and silicon in the form of oxides.

5. A composite ceramic board according to claim 1, wherein said insulating layers contain from 2 to 15% by weight of manganese oxide and from 2 to 15% by weight of silicon oxide, respectively.

6. A composite ceramic board according to claim 1, wherein said dielectric layer contains, as a chief component, at least one kind of oxide crystals selected from the group consisting of mullite, forsterite, enstatite, silica and cordierite.

7. A composite ceramic board according to claim 1, wherein said conductor layers contain at least one kind of a high-melting point metal selected from the group consisting of tungsten and molybdenum together with said low-resistance conductor.

8. A composite ceramic board according to claim 7, wherein said conductor layers contain said low-resistance conductor in an amount of from 10 to 70% by volume and contains said high-melting point metal in an amount of from 30 to 90% by volume.

9. A composite ceramic board according to claim 1, wherein said conductor layers have a sheet resistance of not larger than 8 mΩ/☐ calculated as having a thickness of 15 μm.

10. A composite ceramic board according to any one of claims 1 to 9, wherein said dielectric layer contains forsterite and cordierite as chief crystal phases and, further, contains, as sub-components, at least one of $SiO_2$, Zn, Mn and alkaline earth metals and/or non-lead•non-alkaline borosilicate glass in an amount of from 0.1 to 20% by weight per the whole amount.

11. A composite ceramic board according to claim 10, wherein said dielectric layer contains cordierite in an amount of from 20 to 40% by weight per the whole amount.

12. A composite ceramic board according to claim 10, wherein said insulating layer has a bending strength of not smaller than 350 MPa.

13. A composite ceramic board according to claim 10, wherein said insulating layer contains manganese in an amount of from 2 to 15% by weight calculated as an oxide thereof, contains Si in an amount of from 2 to 15% by weight calculated as an oxide thereof, contains at least one of Mg, Ca, B, Nb, Cr and Co in an amount of from 0.1 to 4% by weight calculated as an oxide thereof, and has a relative density of not smaller than 95%.

14. The method of producing a composite ceramic board according to claim 10, further comprising applying an electrically conducting paste into low-dielectric green sheets and onto alumina green sheets containing an oxide powder that contains at least one of $SiO_2$, Zn, Mn and alkaline earth metals and/or non-lead non-alkali borosilicate glass powder for the forsterite powder and the cordierite powder in an amount of 0.1 to 20% by weight per the whole amount, laminating said low-dielectric green sheets and said alumina green sheets, and firing the obtained aminate at 1200 to 1500° C.

15. A method of producing a composite ceramic board according to claim 14, wherein, prior to laminating said low-dielectric green sheets and said alumina green sheets, via-holes are formed in said low-dielectric green sheets and/or in said alumina green sheets, and said via-holes are filled with an electrically conducting paste.

16. A method of producing a composite ceramic board according to claim 14, wherein said low-dielectric green sheet is prepared by adding said cordierite powder in an amount of from 20 to 40% by weight per the whole amount.

17. A method of producing a composite ceramic board according to claim 14, wherein 2 to 15% by weight of $Mn_2O_3$, 2 to 15% by weight of $SiO_2$, 0.1 to 4% by weight of at least one of MgO, CaO, $B_2O_3$, $Nb_2O_5$, $Cr_2O_3$ and $CoO_3$ and the remainder of alumina power, are mixed together, and are molded to prepare an alumina green sheet.

18. A method of producing a composite ceramic board according to claim 14, wherein said electrically conducting paste is prepared by mixing a copper powder in an amount of 10 to 70% by volume, and a tungsten powder and/or a molybdenum powder in an amount of 30 to 90% by volume.

19. An optical/electronic-mounted circuit substrate comprising:

a composite ceramic board of any one of claims 1 to 9, wherein insulating layers of alumina ceramics and dielectric layers of ceramics having a dielectric constant smaller than that of said insulating layers, are laminated as a unitary structure, and conductor layers containing at least one kind of low-resistance conductor selected from the group consisting of Au, Ag, Cu and Pt are formed on the surfaces and/or in the inside;

an optical waveguide and an optical semiconductor device mounted on one surface side of said composite ceramic board;

an electronic semiconductor device mounted on one surface or on the other surface of said composite ceramic board; and external connection terminals provided on said dielectric layer of said composite ceramic board.

20. An optical/electronic-mounted circuit substrate according to claim 19, wherein said electronic semiconductor device and said optical semiconductor device are mounted on the opposing surfaces of said insulating board.

21. An optical/electronic-mounted circuit substrate according to claim 19, wherein the electronic semiconductor device is contained in a cavity formed in the surface of said insulating substrate, and said cavity is air-tightly sealed with a cap.

22. An optical/electronic-mounted circuit substrate according to claim 19, wherein said dielectric layer of said composite ceramic board is formed on a portion of the surface of said insulating layer.

23. An optical/electronic-mounted circuit substrate according to claim 19, wherein said optical semiconductor device is provided inside said optical waveguide.

24. A mounted board in which an electronic circuit including capacitors, resistors and wiring conductors is formed on the surface of a mother board, an optical/electronic-mounted circuit substrate according to claim 19 is mounted on said electronic circuit via external connection terminals, and a reflection loss of when high-frequency signals of 40 GHz are input to said optical/electronic-mounted circuit substrate is not larger than −10.0 dB.

* * * * *